United States Patent
Ulen et al.

(10) Patent No.: US 6,483,704 B2
(45) Date of Patent: Nov. 19, 2002

(54) MICROPROCESSOR HEAT SINK RETENTION MODULE

(75) Inventors: Neal Ulen, Lacey, WA (US); Chris H. Hanes, Olympia, WA (US); Ed Unrein, Steilacoom, WA (US)

(73) Assignee: Intel Corporation, Santa Clara, CA (US)

(*) Notice: Subject to any disclaimer, the term of this patent is extended or adjusted under 35 U.S.C. 154(b) by 21 days.

(21) Appl. No.: 09/823,625

(22) Filed: Mar. 29, 2001

(65) Prior Publication Data

US 2002/0141158 A1 Oct. 3, 2002

(51) Int. Cl.[7] .................................................. H05K 7/20
(52) U.S. Cl. ...................... 361/704; 361/688; 361/707; 361/709; 257/706; 257/707; 174/16.3; 165/80.3
(58) Field of Search .................................. 361/688, 702, 361/703, 704, 707, 706, 709, 710, 712, 717–720, 722; 257/706–727, 686, 692; 165/80.2, 80.3, 80.4, 185; 174/16.3, 15.1, 252, 15.2; 439/259, 342, 263, 265, 268, 296

(56) References Cited

U.S. PATENT DOCUMENTS

| | | | | |
|---|---|---|---|---|
| 5,949,648 A | * | 9/1999 | Liao | 361/700 |
| 6,164,999 A | * | 12/2000 | McCutchan et al. | 439/342 |
| 6,180,874 B1 | * | 1/2001 | Brezina et al. | 174/16.3 |
| 6,285,550 B1 | * | 9/2001 | Belady | 361/704 |
| 6,320,748 B1 | * | 11/2001 | Roden et al. | 361/704 |

* cited by examiner

Primary Examiner—Darren Schuberg
Assistant Examiner—Michael Datskovsky
(74) Attorney, Agent, or Firm—Mark V. Seeley

(57) ABSTRACT

A microprocessor heat sink retention module is described. That module comprises a first frame that has a first side and a second side. The first side is separated from the second side by a distance that is sufficient to enable a microprocessor to fit within the frame. The first and second sides each have at least one aperture for receiving a microprocessor heat sink. The module also has a heat transfer platform, which is integrated with the first frame. The heat transfer platform comprises a substantially flat metal slab for dissipating heat that is generated by a voltage regulator. Also described are an assembly for a computer and a computer system that include this microprocessor heat sink retention module.

15 Claims, 2 Drawing Sheets

MICROPROCESSOR HEAT SINK RETENTION MODULE

FIELD OF THE INVENTION

The present invention relates to apparatus for retaining and cooling computer components. More specifically, the invention relates to mechanisms for cooling microprocessors and their associated voltage regulators.

BACKGROUND OF THE INVENTION

Because microprocessors generate a significant amount of heat, computers that contain them rely upon various cooling mechanisms to dissipate the heat that they produce. Those mechanisms include different types of fans, heat sinks, heat spreaders, and ducting for delivering a cooling fluid (e.g., air) to the microprocessors for heat exchange. In addition to microprocessors, other computer components may produce heat that must be eliminated. One such component is the voltage regulator that converts a relatively high DC voltage to the relatively low DC voltage that microprocessor operation requires.

Computers generally segregate the microprocessor from the voltage regulator. As a result, the voltage regulator may need its own discrete cooling apparatus, which may include a separate heat sink and several additional parts required for assembly. Employing separate cooling mechanisms for the microprocessor and its associated voltage regulator adds cost and complexity to the overall cooling solution. Accordingly, there is a need for an integrated cooling assembly that serves to dissipate heat from both a microprocessor and a voltage regulator. There is also a need for such a device that can retain a microprocessor heat sink. The present invention provides such a device.

DETAILED DESCRIPTION OF THE PRESENT INVENTION

A microprocessor heat sink retention module is described. That module comprises a first frame that has a first side and a second side. The first side is separated from the second side by a distance that is sufficient to enable a microprocessor to fit within the frame. The first and second sides each have at least one aperture for receiving a microprocessor heat sink. The module also has a heat transfer platform, which is integrated with the first frame. The heat transfer platform comprises a substantially flat metal slab for dissipating heat that is generated by a voltage regulator. Also described are an assembly for a computer and a computer system that include this microprocessor heat sink retention module.

In the following description, numerous details are set forth to provide a thorough understanding of the present invention. It will be apparent to those skilled in the art, however, that the invention may be practiced in many ways other than those expressly described here. The invention is thus not limited by the specific details disclosed below.

Figure 1:
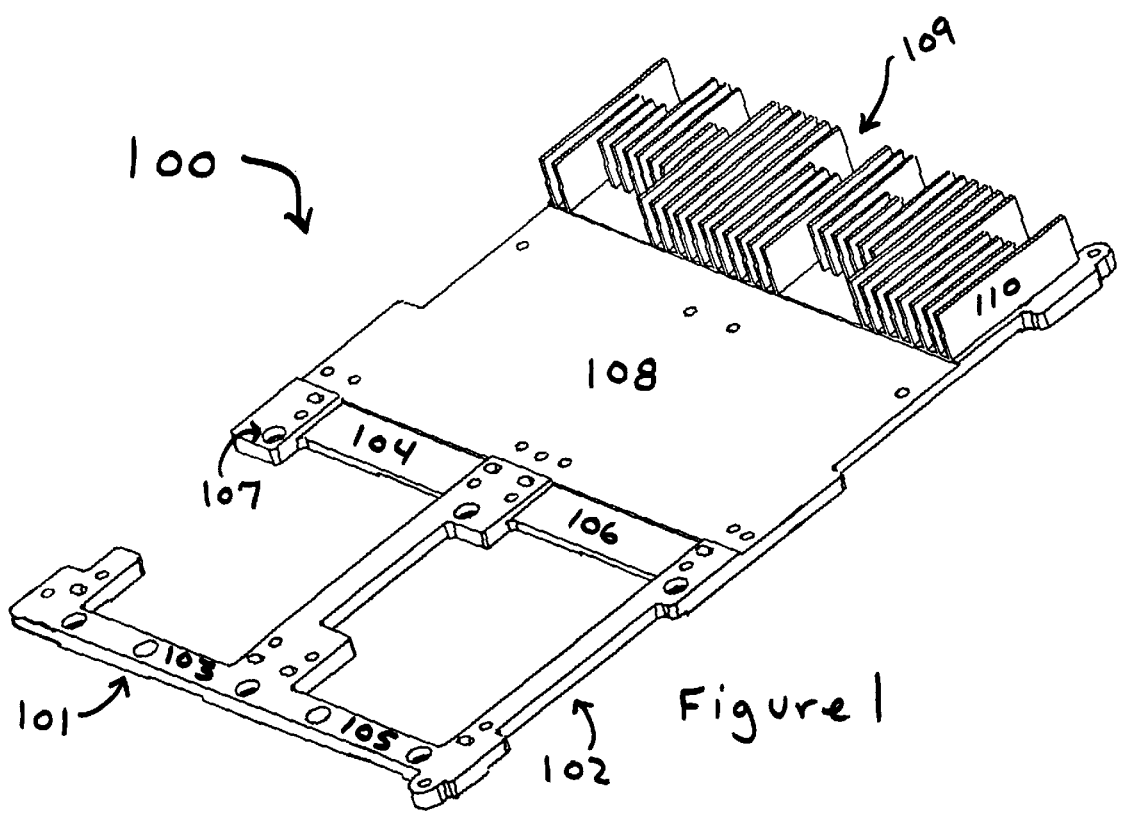
FIG. 1 represents a perspective view of an embodiment of the microprocessor heat sink retention module of the present invention.

As shown in FIG. 1, microprocessor heat sink retention module 100 is an integrated retention and cooling device that acts as a heat sink to dissipate heat from a voltage regulator and performs a microprocessor heat sink retention function. Module 100 includes first frame 101 and second frame 102. Frame 101 has first side 103 and second side 104, and frame 102 has first side 105 and second side 106. First sides 103, 105 are separated from second sides 104, 106 by a distance that is sufficient to enable a microprocessor to fit within frame 101 or frame 102, e.g., a distance that is between about 3 and about 4 inches. First and second sides 103–106 each have apertures 107 for receiving a microprocessor heat sink. Such a heat sink may be mounted on top of a microprocessor to dissipate heat from it.

Module 100 also has heat transfer platform 108, which is integrated with first frame 101 and second frame 102. Heat transfer platform 108 comprises a substantially flat metal slab for dissipating heat that is generated by a voltage regulator. Integrated into module 100 is voltage regulator heat sink 109, which is separated from frames 101 and 102 by platform 108. In this embodiment, that heat sink includes a plurality of fins 110 that increase surface area, facilitating heat exchange with the ambient. Platform 108 preferably is between about 3 and about 4 inches wide (i.e., along the direction of airflow through fins 110) and between about 5 and about 7 inches long (i.e., along the direction transverse to airflow through fins 110).

Module 100 may be made from materials conventionally used to make microprocessor heat sink retention mechanisms, heat spreaders and heat sinks. In a preferred embodiment, module 100 is a one piece integrated unit that is made from aluminum.

Figure 2:
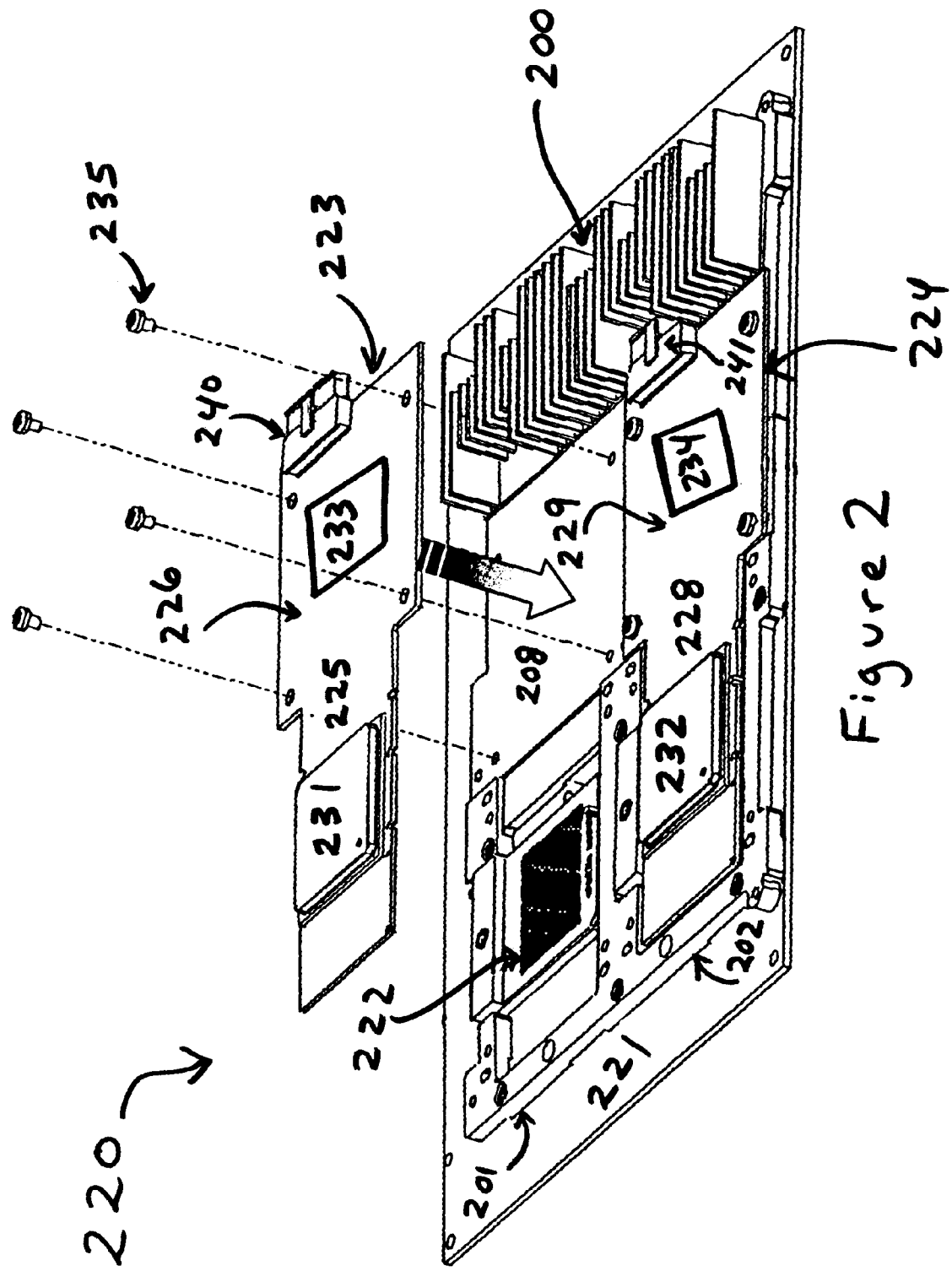
FIG. 2 represents a partially exploded view of a computer system that includes the microprocessor heat sink retention module of FIG. 1.

FIG. 2 represents a partially exploded view of a computer system that includes the microprocessor heat sink retention module of FIG. 1. Computer system 220 includes motherboard 221, which includes first socket 222 for receiving a first microprocessor and a second socket (not shown) for receiving a second microprocessor. System 220 also includes first and second microprocessor modules 223, 224 and microprocessor heat sink retention module 200. Microprocessor module 223 includes first printed circuit board ("PCB") 225, which has top surface 226 and a bottom surface (not shown). Microprocessor module 224 includes second PCB 228, which has top surface 229 and a bottom surface (not shown). First microprocessor 231 is coupled to top surface 226 of first PCB 225, and will be coupled to socket 222 when microprocessor module 223 is mounted to motherboard 221. Second microprocessor 232 is shown already coupled to a socket, which is attached to motherboard 221, and is also coupled to top surface 229 of second PCB 228.

First voltage regulator 233 is coupled to top surface 226 of first PCB 225, and second voltage regulator 234 is coupled to top surface 229 of second PCB 228. Voltage regulators 233, 234 convert a relatively high DC voltage to the relatively low DC voltage that microprocessors 231, 232 require. Voltage regulators 233, 234 may comprise a single integrated circuit (accompanied by a number of supporting circuits and components) or instead comprise several discrete devices, as will be apparent to those skilled in the art. Connectors 240, 241 will receive wires or cables (not shown) for delivering power from a power supply to the voltage regulators. Voltage regulators 233, 234 generate heat that must be dissipated.

Microprocessor heat sink retention module 200 is attached to motherboard 221 such that frames 201, 202 are positioned around the periphery of first socket 222 and a second socket (not shown), respectively. Microprocessor heat sinks (not shown), which will be mounted to the top of microprocessors 231, 232, will be coupled to frames 201, 202. Preferably, separate heat sinks will be mounted on top of microprocessors 231, 232, although alternative embodiments may mount a single heat sink to both microprocessors.

The bottom surfaces of first PCB 225 and second PCB 228 each include a metal sheet (not shown) that will contact heat transfer platform 208 of module 200. That sheet may be made of solder. In addition, PCBs 225, 228 preferably include thermally conductive layers (e.g., layers made of copper) and vias that enable heat transfer from top surfaces 226, 229 to those PCBs' bottom surfaces. Those thermally conductive layers and vias transfer heat, which voltage regulators 233, 234 produce, to those metal sheets, which in turn transfer it to platform 208. Fasteners 235 connect PCBs 225, 228 to module 200 with sufficient clamping force to ensure significant heat transfer from the PCBs to module 200. A thermal grease may be applied between heat transfer platform 208 and the bottom surfaces of PCBs 225, 228 to enhance heat transfer.

Microprocessors 231, 232 are received by the sockets, which are mounted to motherboard 221 in the conventional manner. Microprocessor heat sinks will be mounted to the microprocessors to dissipate heat from them. Fasteners will attach those microprocessor heat sinks to frames 201 and 202. Module 200 thus retains the heat sinks that are used to cool microprocessors 231, 232, while simultaneously providing the cooling mechanism for their associated voltage regulators 233, 234. By integrating these microprocessor heat sink retention and voltage regulator cooling functions, the microprocessor heat sink retention module of the present invention can provide a computer system with a less costly and less complex cooling solution.

Figure 3:
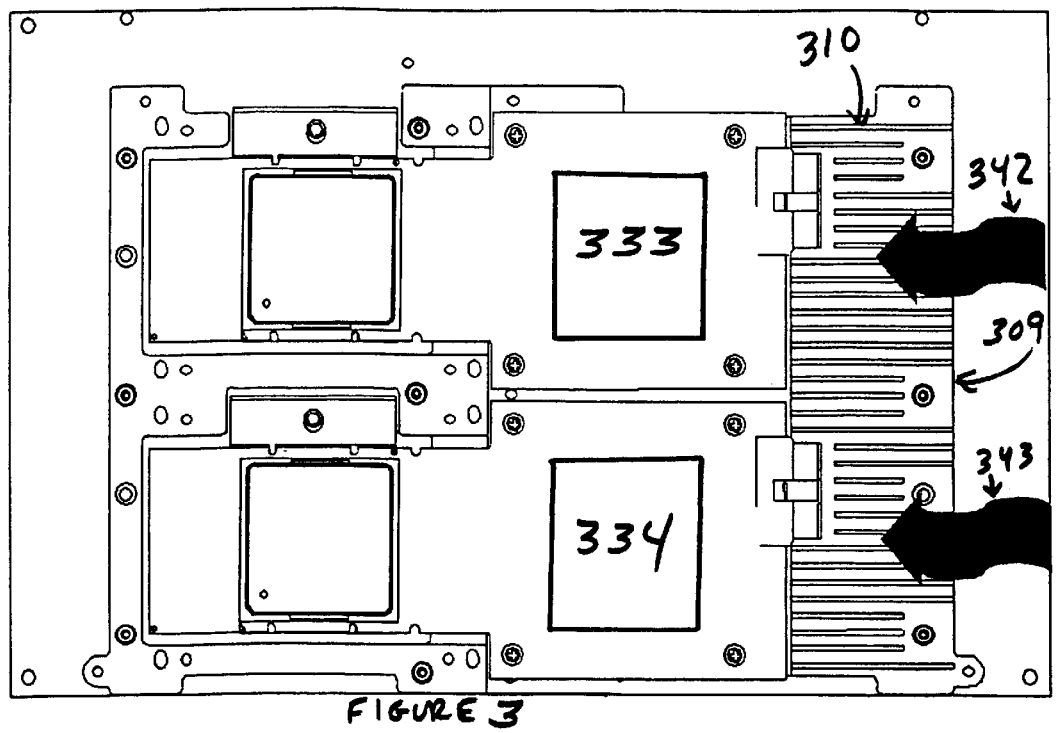
FIG. 3 represents an overhead view of the computer system that is illustrated in FIG. 2.

FIG. 3 represents an overhead view of the computer system that is illustrated in FIG. 2. Arrows 342, 343 illustrate the direction of airflow through fins 310 of voltage regulator heat sink 309, which serves to transfer heat from voltage regulators 333, 334.

Although the embodiments illustrated above represent a microprocessor heat sink retention module designed for use with two microprocessors, other embodiments may be designed for use with one or more than two microprocessors. In single microprocessor embodiments, only a single frame will be integrated with the heat transfer platform and voltage regulator heat sink, and the heat transfer platform may be half the size of the one described above. Such a heat transfer platform may be between about 1.5 and about 2 inches wide and between about 2.5 and about 3.5 inches long. If used with more than two processors, the module may be enlarged to include more frames and a larger heat transfer platform and voltage regulator heat sink.

An improved microprocessor heat sink retention module has been described. That module facilitates cost effective cooling for both a microprocessor and its accompanying voltage regulator. By combining this module with a PCB that integrates the microprocessor with the voltage regulator, the present invention eliminates the need for separate apparatus to cool the voltage regulator, decreasing the cost of a computer system that includes these components.

Features shown in the above referenced drawings are not intended to be drawn to scale, nor are they intended to be shown in precise positional relationship. Additional components that may be included in the illustrated microprocessor heat sink retention module, and assembly and computer system that may use it, have been omitted as they are not useful to describe aspects of the present invention.

Although the foregoing description has specified a microprocessor heat sink retention module that includes certain features, those skilled in the art will appreciate that many modifications and substitutions may be made. It is intended that all such modifications, alterations, substitutions and additions be considered to fall within the spirit and scope of the invention as defined by the appended claims.

What is claimed is:

1. A microprocessor heat sink retention module comprising:
    a first frame having a first side and a second side, the first side being separated from the second side by a sufficient distance to enable a microprocessor to fit within the first frame, the first and second sides each having at least one aperture for receiving a microprocessor heat sink; and
    a heat transfer platform integrated with the first frame, the heat transfer platform comprising a substantially flat metal slab for dissipating heat generated by a voltage regulator.

2. The microprocessor heat sink retention module of claim 1 wherein the heat transfer platform is at least about 1.5 inches wide and at least about 2.5 inches long; and wherein the first side is separated from the second side by between about 3 and about 4 inches.

3. The microprocessor heat sink retention module of claim 2 further comprising a voltage regulator heat sink that is integrated with the first frame and the heat transfer platform such that the heat transfer platform separates the first frame from the voltage regulator heat sink.

4. The microprocessor heat sink retention module of claim 3 wherein the voltage regulator heat sink includes a plurality of fins.

5. The microprocessor heat sink retention module of claim 4 further comprising:
    a second frame having a first side and a second side, the first side being separated from the second side by a sufficient distance to enable a microprocessor to fit within the second frame, the first and second sides each having at least one aperture for receiving a microprocessor heat sink;
    wherein the heat transfer platform and the voltage regulator heat sink are integrated with both the first frame and the second frame.

6. The microprocessor heat sink retention module of claim 5 wherein the heat transfer platform is at least about 3 inches wide and at least about 5 inches long.

7. The microprocessor heat sink retention module of claim 6 wherein the heat transfer platform is between about 3 and about 4 inches wide and between about 5 and about 7 inches long.

8. An assembly for a computer comprising:
    a microprocessor heat sink retention module, that module comprising:
        a first frame that may slide over a microprocessor socket, the first frame having a plurality of apertures located on its periphery for receiving a microprocessor heat sink; and
        a heat transfer platform integrated with the first frame, the heat transfer platform comprising a substantially flat metal slab; and
    a first microprocessor module, which is coupled to the microprocessor heat sink retention module, the first microprocessor module comprising:

a first printed circuit board that includes a top surface and a bottom surface;

a first microprocessor that is coupled to the top surface of the first printed circuit board; and a first voltage regulator that is coupled to the top surface of the first printed circuit board;

in which the bottom surface of the first printed circuit board includes a metal sheet that contacts the heat transfer platform of the microprocessor heat sink retention module.

9. The assembly of claim 8 wherein the microprocessor heat sink retention module further comprises a voltage regulator heat sink that is integrated with the first frame and the heat transfer platform such that the heat transfer platform separates the first frame from the voltage regulator heat sink.

10. The assembly of claim 9 wherein the microprocessor heat sink retention module further comprises:

a second frame that may slide over a microprocessor socket, the second frame having a plurality of apertures located on its periphery for receiving a microprocessor heat sink, wherein the heat transfer platform is integrated with both the first frame and the second frame;

and further comprising:

a second microprocessor module, which is coupled to the microprocessor heat sink retention module, the second microprocessor module comprising:

a second printed circuit board that includes a top surface and a bottom surface;

a second microprocessor that is coupled to the top surface of the second printed circuit board; and a second voltage regulator that is coupled to the top surface of the second printed circuit board;

in which the bottom surface of the second printed circuit board includes a metal sheet that contacts the heat transfer platform of the microprocessor heat sink retention module.

11. A computer system comprising:

a motherboard with a first socket for receiving a first microprocessor;

a first microprocessor module comprising:

a first printed circuit board that includes a top surface and a bottom surface;

a first microprocessor that is coupled to both the first socket and the top surface of the first printed circuit board; and a first voltage regulator that is coupled to the top surface of the first printed circuit board; and a microprocessor heat sink retention module, that module comprising:

a first frame that is positioned around the periphery of the first socket, the first frame being coupled to a microprocessor heat sink; and a heat transfer platform integrated with the first frame, the heat transfer platform comprising a substantially flat metal slab.

12. The computer system of claim 11 wherein the bottom surface of the first printed circuit board includes a metal sheet that contacts the heat transfer platform of the microprocessor heat sink retention module.

13. The computer system of claim 12 wherein the microprocessor heat sink retention module further comprises a voltage regulator heat sink that is integrated with the first frame and the heat transfer platform such that the heat transfer platform separates the first frame from the voltage regulator heat sink.

14. The computer system of claim 13 wherein the motherboard further comprises a second socket for receiving a second microprocessor; wherein the microprocessor heat sink retention module further comprises:

a second frame that is positioned around the periphery of the second socket, the second frame being coupled to a microprocessor heat sink, wherein the heat transfer platform is integrated with both the first frame and the second frame;

and further comprising:

a second microprocessor module, which is coupled to both the second socket and the microprocessor heat sink retention module, the second microprocessor module comprising:

a second printed circuit board that includes a top surface and a bottom surface;

a second microprocessor that is coupled to the top surface of the second printed circuit board; and a second voltage regulator that is coupled to the top surface of the second printed circuit board.

15. The computer system of claim 14 wherein the bottom surface of the second printed circuit board includes a metal sheet that contacts the heat transfer platform of the microprocessor heat sink retention module; and wherein separate heat sinks are mounted on top of the first microprocessor and the second microprocessor.

* * * * *